United States Patent
Chen et al.

(10) Patent No.: US 9,306,102 B2
(45) Date of Patent: Apr. 5, 2016

(54) BACK CONTACT SOLAR MODULE AND ELECTRODE SOLDERING METHOD THEREFOR

(75) Inventors: Yi-Chia Chen, Hsin-Chu (TW); De-Chih Liu, Hsin-Chu (TW); Ming-Yuan Huang, Hsin-Chu (TW); Chiu-Hua Huang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 1123 days.

(21) Appl. No.: 13/241,258

(22) Filed: Sep. 23, 2011

(65) Prior Publication Data

US 2013/0014801 A1    Jan. 17, 2013

(30) Foreign Application Priority Data

Jul. 12, 2011 (TW) .............................. 100124670 A (51) Int. Cl.
*H01L 31/044* (2014.01)
*H01L 31/05* (2014.01)

(52) U.S. Cl.
CPC .............. *H01L 31/0516* (2013.01); *Y02E 10/50* (2013.01)

(58) Field of Classification Search
CPC ........ H01L 31/00–31/078; Y02E 10/50–10/60
USPC .................................................. 136/136–243
See application file for complete search history.

(56) References Cited

U.S. PATENT DOCUMENTS

| 2005/0263178 A1* | 12/2005 | Montello et al. ............... 136/244 |
| 2007/0199592 A1* | 8/2007 | Agui et al. .................... 136/256 |
| 2011/0073165 A1* | 3/2011 | Lee ............................. 136/251 |
| 2011/0120530 A1* | 5/2011 | Isaka ........................... 136/251 |

FOREIGN PATENT DOCUMENTS

| JP | 2005191125 A | 7/2005 |
| TW | I244790 | 12/2005 |
| TW | M396488 | 1/2011 |
| WO | 2010146607 | 12/2010 |

* cited by examiner

Primary Examiner — Bach Dinh
(74) *Attorney, Agent, or Firm* — Winston Hsu; Scott Margo (57) ABSTRACT

A back contact solar module and an electrode soldering method therefor are disclosed. The back contact solar module includes a substrate, two solar cells formed on the substrate, and a curved solder part. The curved solder part is soldered onto an electrode solder pad of each solar cell. The curved solder part has a curved portion between the two solder pads. The curved portion curves parallel to the substrate. Therefore, the invention utilizes the elasticity in structure or the allowable deformation of the curved portion to release the internal stress induced by the soldering on the electrode pads or by a following lamination packaging, which solves the problem in the prior art that the internal residual stress in an electrode solder part harmfully affects the electrical connection between solar cells.

4 Claims, 8 Drawing Sheets

BACK CONTACT SOLAR MODULE AND ELECTRODE SOLDERING METHOD THEREFOR

BACKGROUND OF THE INVENTION

1. Field of the Invention

The invention relates to a back contact solar module and an electrode soldering method therefor, and especially relates to a back contact solar module with a curved solder part and an electrode soldering method therefor.

2. Description of the Prior Art

As the solar photovoltaic conversion efficiency is getting improving, solar cells have been one of the choices of power sources for electronic apparatuses. A current solar module generally includes a plurality of solar cells formed on a substrate. These solar cells need to be electrically connected in series so as to provide needed voltage and current. A common back contact solar module is illustrated herein as an example. It uses a straight metal ribbon to dispose between adjacent solar cells to be soldered onto the electrode solder pads of the adjacent solar cells. Because the temperature of a common soldering in series may reach more than two hundreds degrees, there is residual stress induced inside the metal ribbon when the temperature is back to a room temperature after the metal ribbon is soldered onto the electrode solder pads. If the residual stress is too high or the distribution thereof is excessively non-uniform, the soldering may fail or the solar cells may break. Furthermore, the solar cells after being soldered in series are to be packed under a lamination process for structural protection. At this moment, the metal ribbon suffers pressure leading to inducing internal stress. The internal stress interacts with the above residual stress may also make the soldering fail or the solar cells break.

SUMMARY OF THE INVENTION

An objective of the invention is to provide a back contact solar module, using a curved solder part to release the internal stress therein lest the electrode soldering should fail or the solar cells should break.

The back contact solar module of the invention includes a substrate, a first solar cell, a second solar cell, and a curved solder part. The first solar cell is formed on the substrate and includes a first electrode solder pad. The second solar cell is formed on the substrate and includes a second electrode solder pad. The curved solder part is soldered onto the first electrode solder pad and the second electrode solder pad. The curved solder part includes a curved portion between the first electrode solder pad and the second electrode solder pad. The curved portion curves parallel to the substrate. Therefore, the curved portion has elasticity in structure and allows larger deformation so that the curved solder part can release the internal stress induced by the electrode soldering and the curved solder part also provides a larger allowance of manufacturing in a following lamination process.

Another objective of the invention is to provide an electrode soldering method for a back contact solar module, soldering a curved solder part on electrodes so as to release the internal stress therein lest the electrode soldering should fail or the solar cells should break.

The electrode soldering method of the invention is first to prepare a substrate and a first solar cell and a second solar cell on the substrate. The first solar cell includes a first electrode solder pad. The second solar cell includes a second electrode solder pad. The electrode soldering method is then to place a curved solder part on the first electrode solder pad and the second electrode solder pad. The curved solder part includes a curved portion between the first electrode solder pad and the second electrode solder pad. The curved portion curves parallel to the substrate. Afterward, the electrode soldering method is to solder the curved solder part on the first electrode solder pad and the second electrode solder pad simultaneously. Similarly, because the curved portion has elasticity in structure and allows larger deformation so that the curved solder part can release the internal stress induced by the electrode soldering and the curved solder part also provides a larger allowance of manufacturing in a following lamination process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
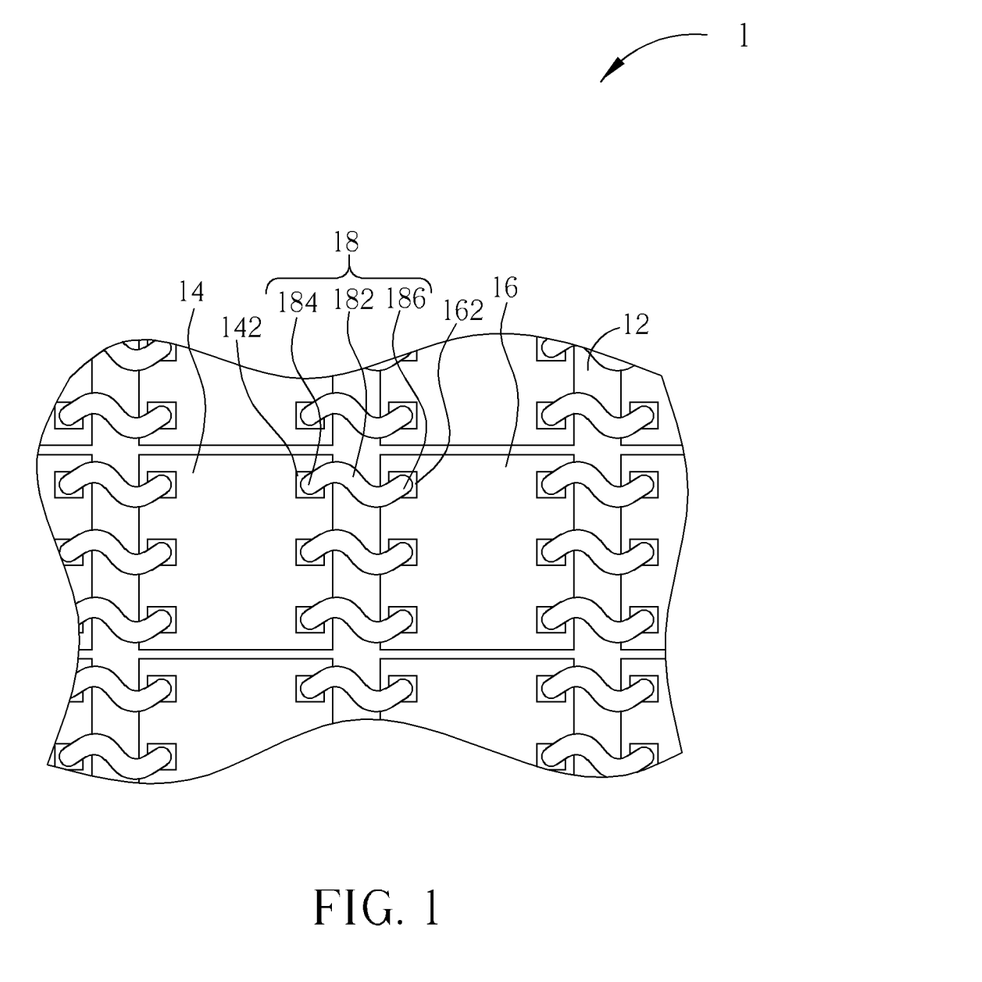
FIG. 1 is a top view of a back contact solar module of a preferred embodiment according to the invention.

Please refer to FIG. 1, which is a top view of a back contact solar module 1 of a preferred embodiment according to the invention. The back contact solar module 1 includes a substrate 12, a plurality of solar cells 14 and 16, and a plurality of curved solder parts 18; therein, the solar cells 14 and 16 are arranged in matrix on the substrate 12. The curved solder parts 18 are used for electrically connecting the solar cells 14 and 16. For simple illustration, the following description is based on adjacent two of the solar cells 14 and 16 and one of the curved solder parts 18 between the adjacent two solar cells 14 and 16. The description for the other solar cells and the curved solder parts is similar and is not to be described additionally.

Figure 2:
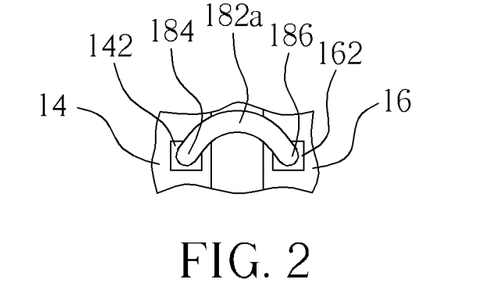
FIG. 2 is a top view of the curved solder part provided with a curved portion of C-shaped structure of an embodiment.
Figure 3:
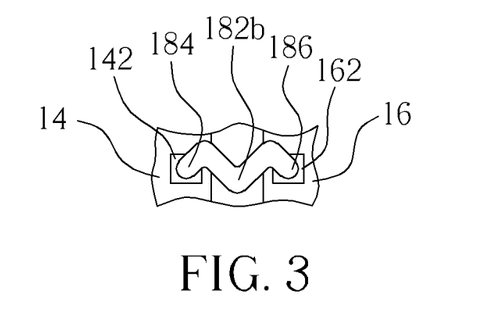
FIG. 3 is a top view of the curved solder part provided with a curved portion of polyline-shaped structure of an embodiment.
Figure 4:
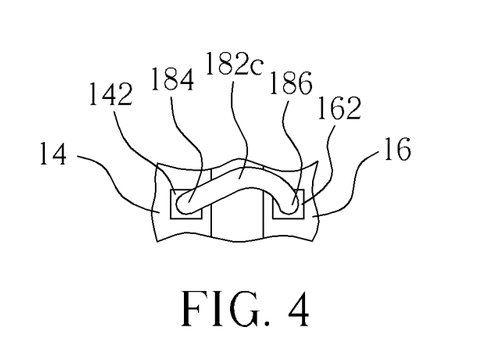
FIG. 4 is a top view of the curved solder part provided with a curved portion of non-linear structure of an embodiment.

As shown in FIG. 1, the first solar cell 14 is formed on the substrate 12 and includes a first electrode solder pad 142. The second solar cell 16 is formed on the substrate 12 and includes a second electrode solder pad 162. The curved solder part 18 includes a curved portion 182, a first soldering portion 184, and a second soldering portion 186. The curved solder part 18 is soldered onto the electrode solder pad 142 and the electrode solder pad 162 through the first soldering portion 184 and the second soldering portion 186 respectively. The curved portion 182 is disposed between the first electrode solder pad 142 and the second electrode solder pad 162 and parallel to the substrate 12; that is, the extension direction of the curving of the curved portion 182 is parallel to the substrate 12. The internal stress in the curved solder part 18 can be released or reduced by use of the property of being able to stretched and bent of the curved portion 182. Similarly, in the following lamination process, the internal stress or structural deformation of the curved solder part 18 possibly induced by external force thereon also can be released or reduced by the stretching or bending of the curved portion 182. Therefore, the curved solder part 18 can be kept in being electrically connected to the solar cells 14 and 16 all the time; the solar cells 14 and 16 can be kept from being dragged by the curved solder part 18 leading to breakage. In the embodiment, the curved portion 182 is S-shaped, but the invention is not limited to it. In practice, the curved portion 182 can be C-shaped (shown as the curved portion 182a in FIG. 2), polyline-shaped (shown as the curved portion 182b in FIG. 3), non-linear (shown as the curved portion 182c in FIG. 4), or other structural shape of being able to be stretched or bent.

Figure 5:
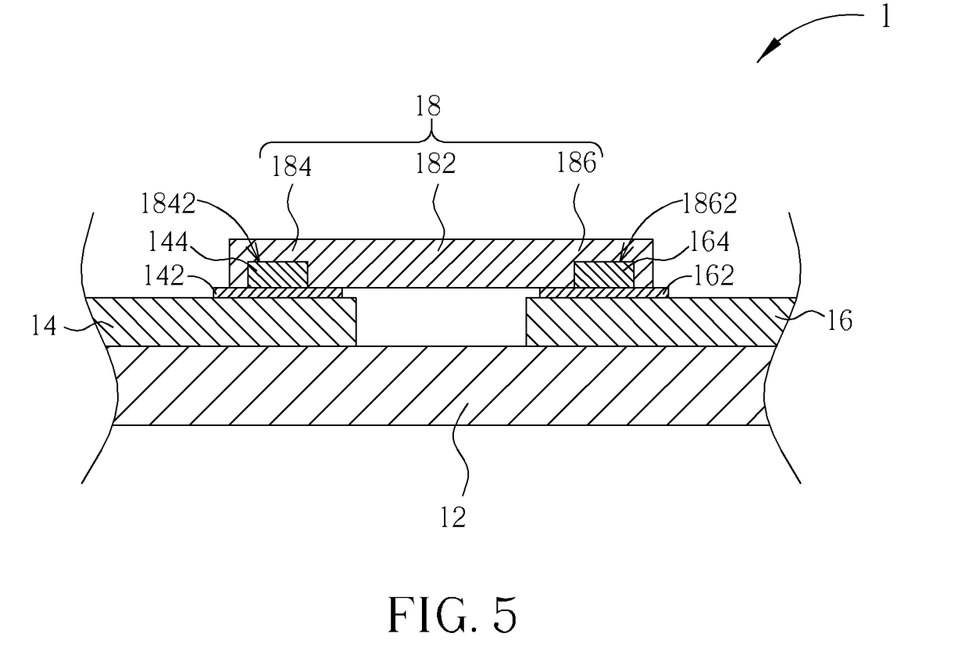
FIG. 5 is a sectional view of the back contact solar module in FIG. 1.

For the connection structure of the curved solder part 18 with the first electrode solder pad 142 and the second electrode solder pad 162, please refer to FIG. 5, which is a sectional view of the back contact solar module 1. In the embodiment, the curved solder part 18 includes a first indentation 1842 and a second indentation 1862 corresponding to the first electrode solder pad 142 and the second electrode solder pad 162 respectively. The first solar cell 14 includes a first solder ball 144 on the first electrode solder pad 142. The second solar cell 16 includes a second solder ball 164 on the second electrode solder pad 162. Therein, the first indentation 1842 and the second indentation 1862 have positioning effect on the first solder ball 144 and the second solder ball 164 respectively, so that the curved solder part 18 can be placed precisely. The first solder ball 144 and the second solder ball 164 are melted in the first indentation 1842 and the second indentation 1862 respectively such that the curved solder part 18 is soldered to the first electrode solder pad 142 and the second electrode solder pad 162. It is added that FIG. 5 shows the configuration of the melted solder balls 144 and 164. In practice, before the soldering, the solder balls 144 and 164 are spheres, but the invention is not limited to it. In addition, the solder balls 144 and 164 generally are made mainly of tin alloy. In order to improve the solderability of the curved solder part 18, the curved solder part 18 can be made of a metal ribbon coated with tin alloy. Therein, the tin alloy can be Sn—Pb alloy, Sn—Ag alloy, Sn—Ag—Su alloy, or other alloy suitable for soldering. It is added that, in principle, the coating material on the metal ribbon and the material of the solder balls 144 and 164 can be the same or be easy to be mutually solved in or to react with each other. Furthermore, if the metal ribbon can react with the solder balls 144 and 164 to form an interfacial reacted layer for example, the coating layer for the metal ribbon can be skipped. In addition, in practice, the indentations 1842 and 1862 can be formed by a pressing process. The surfaces of the curved solder part 18 opposite to the indentations 1842 and 1862 are not limited to be flat entirely.

Figure 6:
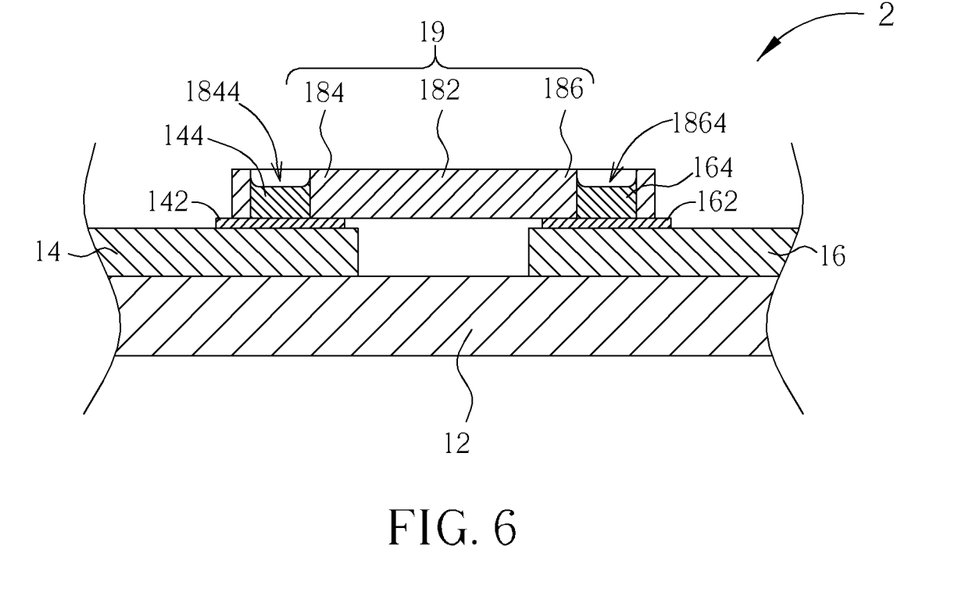
FIG. 6 is a sectional view of a back contact solar module of another embodiment.

The above-mentioned curved solder part 18 uses the indentations 1842 and 1862 to accommodate the solder balls 144 and 164, but the invention is not limited to it. Please refer to FIG. 6, which is a sectional view of a back contact solar module 2 of another embodiment. The main difference between the back contact solar module 2 and the back contact solar module 1 is that the curved solder part 19 of the back contact solar module 2 includes a first through hole 1844 and a second through hole 1864 corresponding to the first electrode solder pad 142 and a second electrode solder pad 162 respectively to replace the first indentation 1842 and the second indentation 1862 respectively of the curved solder part 18. In practice, the through holes 1844 and 1864 also can be made by a pressing process. Similarly, the first solder ball 144 and the second solder ball 164 are melted in the first through hole 1844 and the second through hole 1864 respectively so that the curved solder part 19 is soldered onto the first electrode solder pad 142 and the second electrode solder pad 162. It is added that, controlling the volume of the solder balls 144 and 164 can keep melted tin from overflow out of the through holes 1844 and 1864. The other description of the curved solder part 19 can refer to the above-mentioned description of the curved solder part 18, which is no longer described herein.

Figure 7:
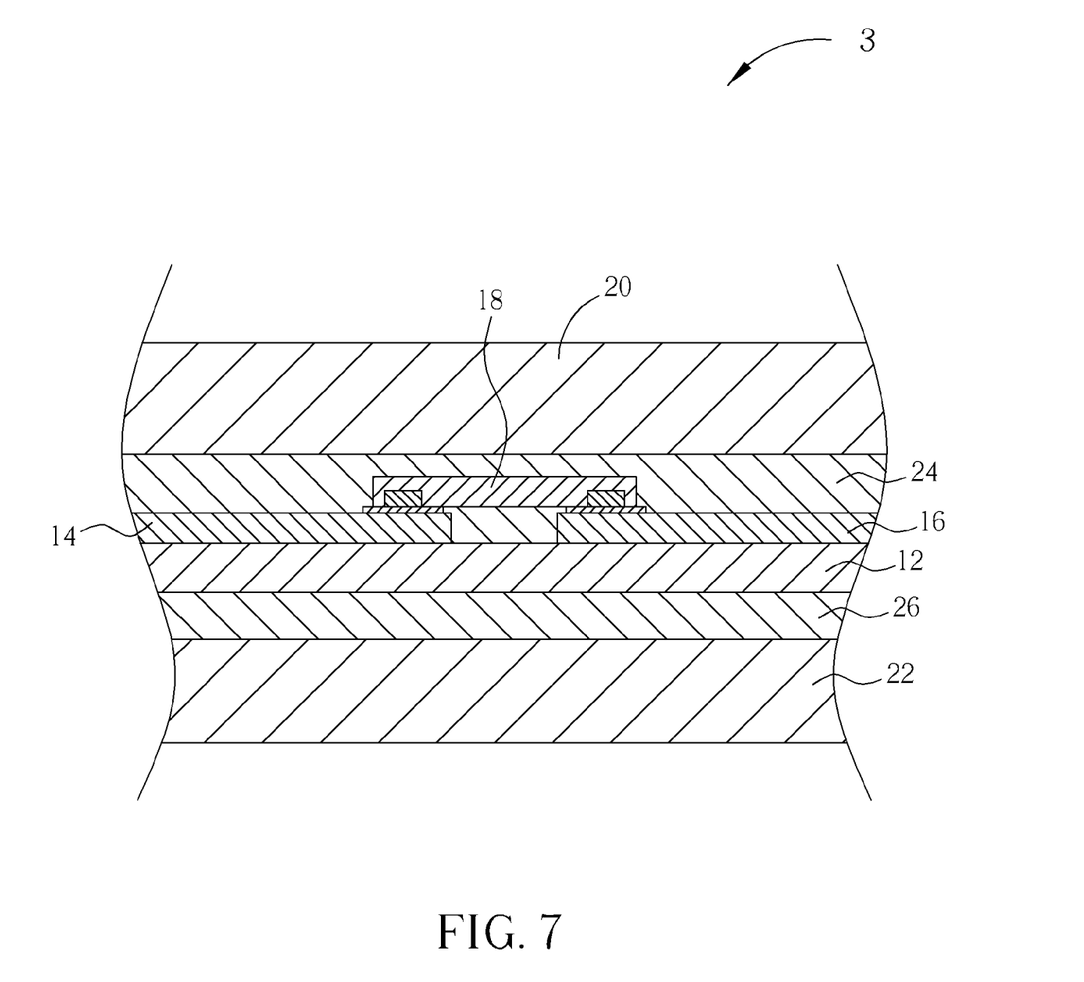
FIG. 7 is a sectional view of a back contact solar module of another preferred embodiment according to the invention.

In general, a back contact solar module usually includes protection structure. Please refer to FIG. 7, which is a sectional view of a back contact solar module 3 of another preferred embodiment according to the invention. The back contact solar module 3 further includes a back plate 20 and a glass 22 more than the back contact solar module 1. The back contact solar module 3 includes a packing film of thermal adhesive 24 disposed between the back plate 20 and the solar cells 14 and 16 such that the back plate 20 adheres to the solar cells 14 and 16. The back contact solar module 3 includes another packing film of thermal adhesive 26 disposed between the glass 22 and the substrate 12 such that the glass 22 adheres to the substrate 12. The above adhesion can be performed in a lamination process; therein, the packing films of thermal adhesive 24 and 26 can be made of Ethylene Vinyl Acetate (EVA) or other high polymer thermal adhesive. In the embodiment, the substrate 12 and the glass 22 are light-penetrable. The glass 22 can protect the light-in surface of the back contact solar module 3. The back plate 20 can be regarded as structure supporting for the back contact solar module 3.

Figure 8:
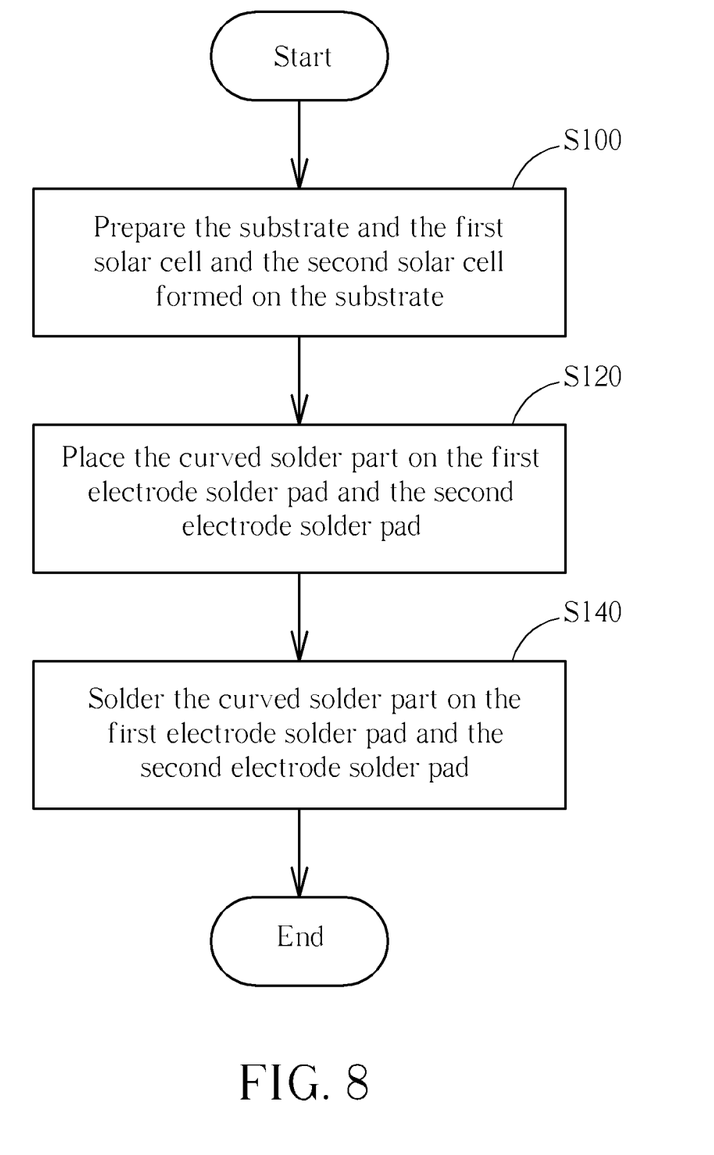
FIG. 8 is a flow chart of an electrode soldering method for the back contact solar module according to the invention.

Please refer to FIG. 8, which is a flow chart of an electrode soldering method for the back contact solar module according to the invention. For simple illustration, the following description is based on the back contact solar modules 1, 2 and 3 in the above embodiments. For the description of every component, please refer to the above description. It is no longer described herein. The electrode soldering method of the invention is first to prepare the substrate 12 and the first solar cell 14 and the second solar cell 16 formed on the substrate 12, shown as the step S100. The first solar cell 14 includes the first electrode solder pad 142. The second solar cell 16 includes the second electrode solder pad 162. Next, the electrode soldering method is to place the curved solder part 18 or 19 on the first electrode solder pad 142 and the second electrode solder pad 162, shown as the step S120. The curved solder part 18 or 19 includes the curved portion 182 between the first electrode solder pad 142 and the second electrode solder pad 162. The curved portion 182 curves parallel to the substrate 12. The electrode soldering method is then to solder the curved solder part 18 or 19 on the first electrode solder pad 142 and the second electrode solder pad 162, shown as the step S140.

Figure 9:
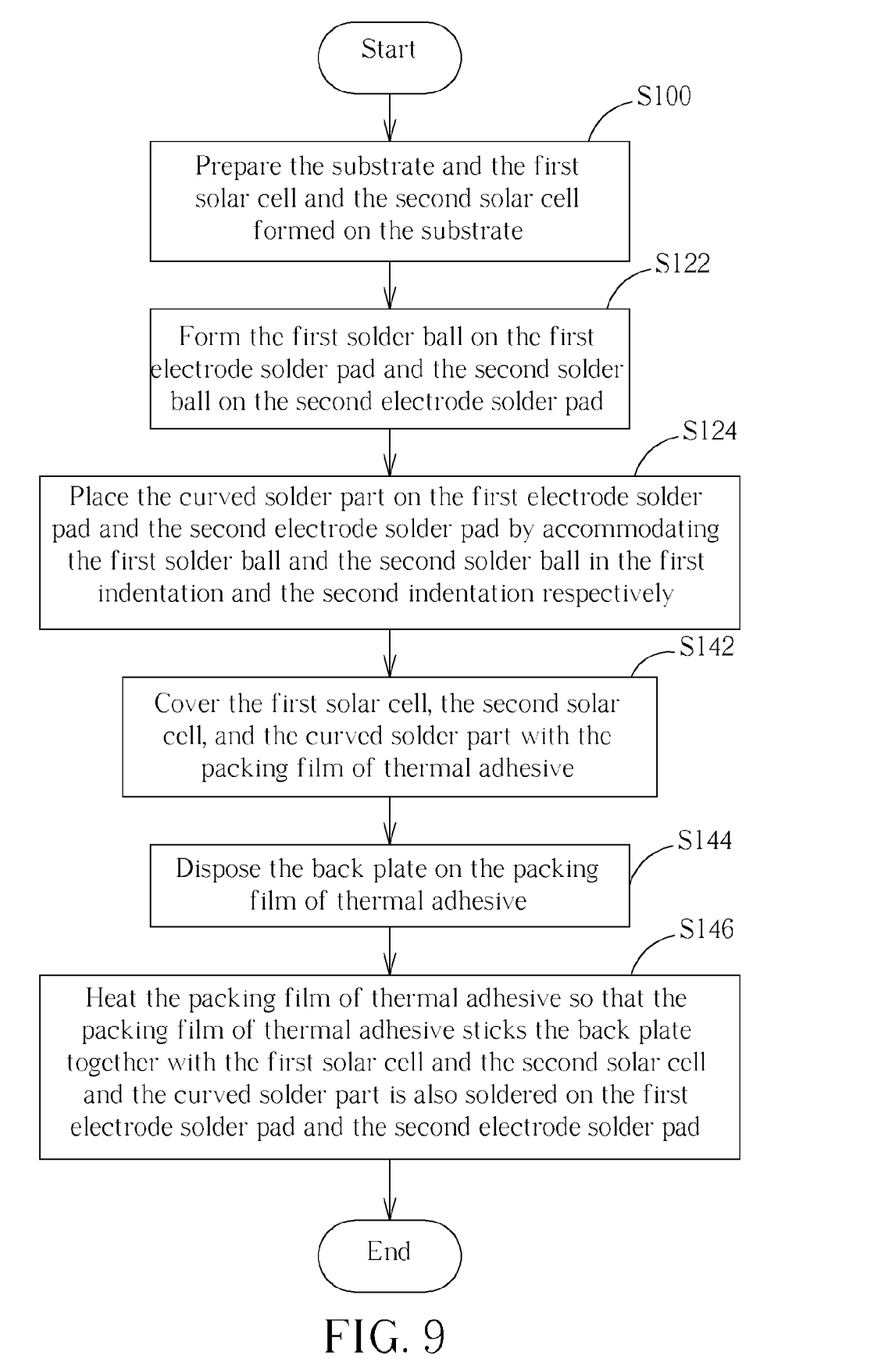
FIG. 9 is a flow chart of an electrode soldering method of an embodiment according to the invention.
Figure 10:
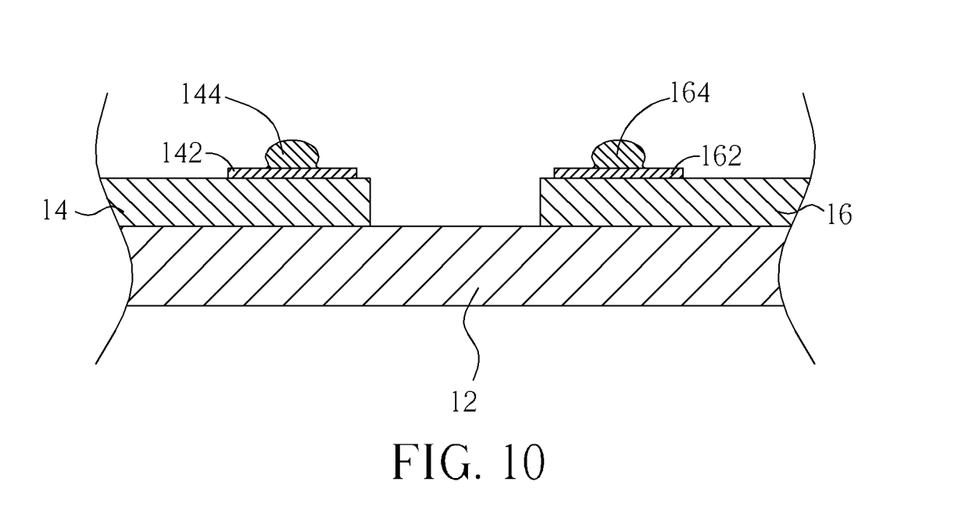
FIGS. 10 through 12 are sectional views of a back contact solar module of the invention in different steps according to the flowchart in FIG. 9.
Figure 11:
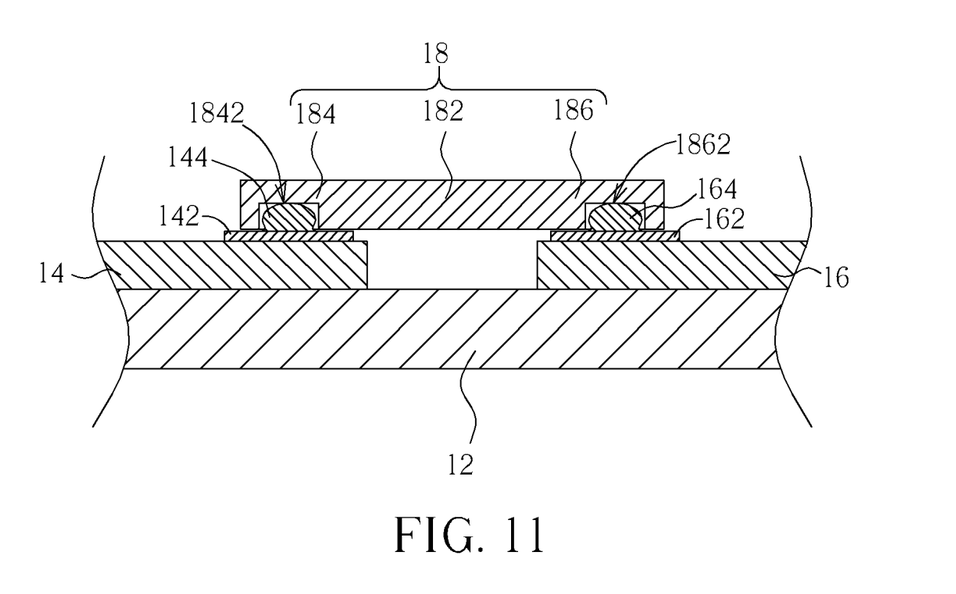

For the detailed description of the soldering process of the curved solder part 18, please refer to FIG. 9, which is a flow chart of an electrode soldering method of an embodiment according to the invention. The flow chart is based on the flow chart in FIG. 8. Therefore, the following description focuses on the difference therebetween; for the other related description, please refer to the description of the above-mentioned flow chart. The step S120 of the electrode soldering method of the invention is performed by the following steps. The electrode soldering method is to form the first solder ball 144 on the first electrode solder pad 142 and the second solder ball 164 on the second electrode solder pad 162, shown as the step S122. After the step S122 is completed, the sectional view is shown as FIG. 10. Then, the curved solder part 18 is placed on the first electrode solder pad 142 and the second electrode solder pad 162 simultaneously by accommodating the first solder ball 144 and the second solder ball 164 in the first indentation 1842 and the second indentation 1862 respectively, shown as the step S124. After the step S124 is completed, the sectional view is shown as FIG. 11.

Figure 12:
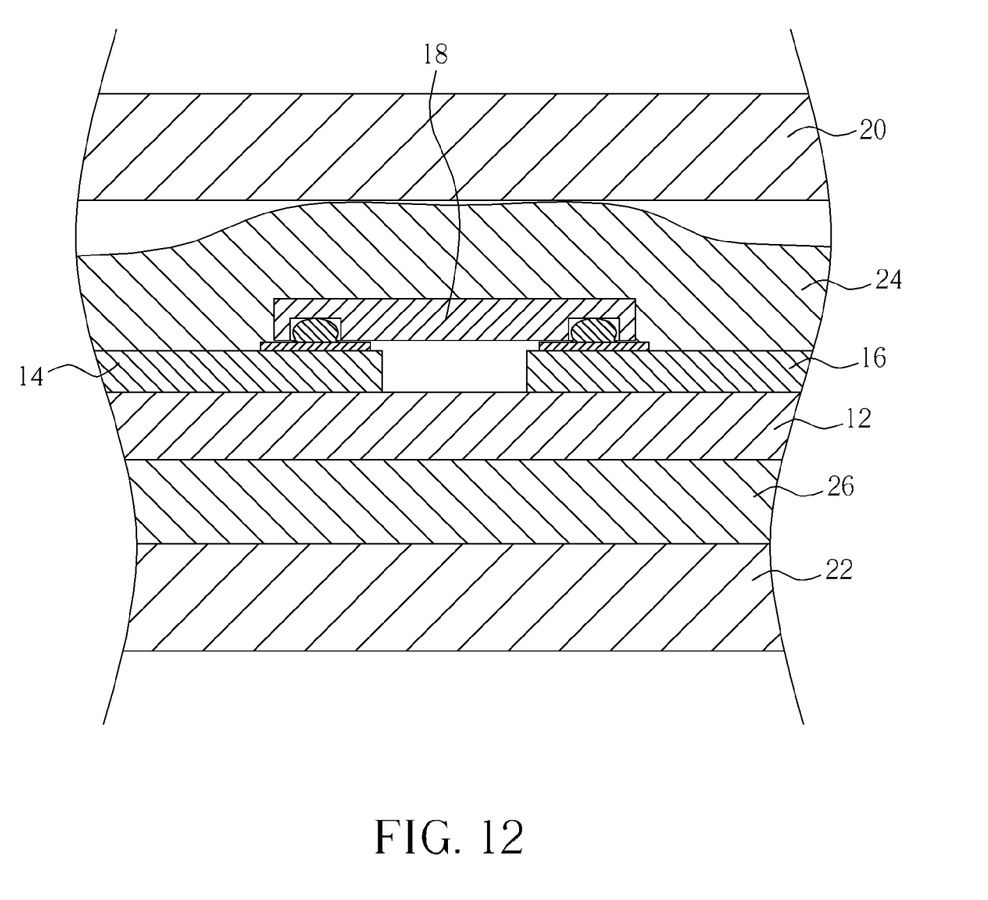

Furthermore, the step S140 of the electrode soldering method of the invention can be performed by the following steps. The electrode soldering method is to cover the first solar cell 14, the second solar cell 16, and the curved solder part 18 with the packing film of thermal adhesive 24, shown as the step S142; to dispose the back plate 20 on the packing film of thermal adhesive 24, shown as the step S144. It is added that the glass 22 for protecting the light-in surface and the packing film of thermal adhesive 26 for adhering the glass 22 usually are disposed in the above steps. After the above steps are completed, the sectional view is shown as FIG. 12. The electrode soldering method is then to heat the packing film of thermal adhesive 24 so as to soften the packing film of thermal adhesive 24 to stick the back plate 20 together with the first solar cell 14 and the second solar cell 16 and also to make the curved solder part 18 be soldered onto the first electrode solder pad 142 and the second electrode solder pad 162 simultaneously, shown as the step S146; therein, the first solder ball 144 and the second solder ball 164 are melted in the first indentation 1842 and the second indentation 1862. When the glass 22 is also disposed, the packing film of thermal adhesive 26 is also heated so as to stick the glass 22 to the substrate 12. After the step S146 is completed, the sectional view is shown as FIG. 7.

It is added that the above steps S142~S146 can be performed in a laminator. Therein, the steps S142 and S144 can be performed under a vacuum; the step S146 can be performed under an atmospheric pressure. The heating temperature in the step S146 depends on the material of packing films of thermal adhesive 24 and 26. For EVA, the heating temperature is 150 degrees Celsius; however, the invention is not limited to it. Furthermore, in the embodiment, the solder balls 144 and 164 are made of proper material such that they can perform soldering function under the above heating temperature and the loading force by other components such as the back plate 20. So the electrode soldering method of the invention can exclude a conventional process of soldering in series with soldering-in-series equipment, so as to avoid broken cells due to the process of soldering in series. In addition, compared to the prior art, because the curved solder part 18 has not been fixed yet before the lamination process, the back contact solar module of the invention is able to slightly adjust the position of the curved solder part 18 in coordination with the disposition of the back plate 20, so as to reduce the residual stress in the curved solder part 18 induced by the soldering. Moreover, most of the residual stress can be released by the deformation of the curved portion 182 of the curved solder part 18 further to reduce the structural influence of the residual stress on the electrical connection and the solar cells 14 and 16. Besides, after completed, the back contact solar module still can reduce a residual stress possibly induced during the following use by the curved portion 182 of the curved solder part 18. For example, the residual stress can be induced by thermal expansion or contraction due to temperature difference of operation environment or by loading force in a product assembly or a maintenance operation.

It is added more that, the detailed description of the soldering process of the curved solder part 19 is similar to that of the curved solder part 18, so the following will focus on the main difference therebetween. The other description of the soldering process of the curved solder part 19 can refer to that of curved solder part 18 and is not described in particular. Please refer to FIG. 9 and FIG. 6. Because the curved solder part 19 is provided with the first through hole 1844 and the second through hole 1864 instead of the first indentation 1842 and the second indentation 1862 of the curved solder part 18, in the step S124, the electrode soldering method is to place the curved solder part 19 on the first electrode solder pad 142 and the second electrode solder pad 162 alternatively by accommodating the first solder ball 144 and the second solder ball 164 in the first through hole 1844 and the second through hole 1864 respectively. Besides, in the step S146, the first solder ball 144 and the second solder ball 164 are melted in the first through hole 1844 and the second through hole 1864 respectively.

As discussed above, the back contact solar module and the electrode soldering method of the invention can release internal stress in the solder part by the curved structure of the curved solder part. Whether the internal stress is induced by the soldering process or the following process, even by use, the curved portion of the curved solder part can perform a certain reduction in the internal stress. Therefore, the invention uses the elasticity in structure or the allowance of deformation of the curved portion of the solder part to provide a stable electrical connection between the solar cells lest the electrode soldering should fail or the solar cells should break and also to enlarge the tolerance of manufacturing parameters so as further to improve the yield rate. In addition, the curved portion still can perform reducing residual stress during the product usage, further to extend the service life of product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A back contact solar module, comprising:
a substrate;
a first solar cell, formed on the substrate, the first solar cell comprising a plurality of first electrode solder pads;
a second solar cell, formed on the substrate, the second solar cell comprising a plurality of second electrode solder pads corresponding to the plurality of the first electrode solder pads; and
a plurality of separate curved solder parts, soldered onto the plurality of the first electrode solder pads and the plurality of the second electrode solder pads correspondingly, at least one of the curved solder parts comprising a curved portion between the corresponding first electrode solder pad and the corresponding second electrode solder pad, the curved portion curving parallel to the substrate, at least one of the curved solder parts comprising a first indentation and a second indentation, each of the first indentation and the second indentation being close-ended with one opening facing the corresponding one of the first electrode solder pads and the second electrode solder pads;
wherein the first solar cell comprises a first solder ball, the first solder ball is disposed on the first electrode solder pad corresponding to the first indentation and accommodated in the first indentation so as to position the corresponding curved solder part, and the first solder ball is melted in the first indentation so as to solder the corresponding curved solder part onto the corresponding first electrode solder pad, and wherein the second solar cell comprises a second solder ball, the second solder ball is disposed on the second electrode solder pad corresponding to the second indentation and accommodated in the second indentation so as to position the corresponding curved solder part, and the second solder ball is melted in the second indentation so as to solder the corresponding curved solder part onto the corresponding second electrode solder pad.

2. The back contact solar module of claim 1, wherein the curved portion is S-shaped, C-shaped, polyline-shaped, or non-straight.

3. The back contact solar module of claim 1, wherein each curved solder part is a metal ribbon coated with tin alloy.

4. The back contact solar module of claim 1, further comprising a packing film of thermal adhesive and a back plate, the packing film of thermal adhesive being disposed between the back plate and the first solar cell and the second solar cell so as to make the back plate adhere to the first solar cell and the second solar cell.

\* \* \* \* \*